United States Patent [19]

Kaganowicz et al.

[11] 4,339,471

[45] Jul. 13, 1982

[54] METHOD OF COATING SUBSTRATES WITH AN ABRASIVE LAYER

[75] Inventors: Grzegorz Kaganowicz, Princeton, N.J.; John W. Robinson, Levittown, Pa.

[73] Assignee: RCA Corporation, New York, N.Y.

[21] Appl. No.: 255,505

[22] Filed: Apr. 20, 1981

[51] Int. Cl.$^3$ .............................................. B05D 3/06
[52] U.S. Cl. ....................................... 427/40; 427/39; 427/255.3; 427/295; 427/296; 427/337
[58] Field of Search ................ 427/39, 40, 255.3, 295, 427/296, 337

[56] References Cited

U.S. PATENT DOCUMENTS 4,104,832  8/1978  Keizer .............................. 51/281 R
4,243,395  1/1981  Dholakia ............................. 51/293
4,260,647  4/1981  Wang et al. ............................ 427/40

OTHER PUBLICATIONS

Joyce et al., "Silicon Oxide and Nitride Films Deposited by an R. F. Glow-Discharge", *Thin Solid Films*, vol. 1, pp. 481-494, (1967-1968).

Primary Examiner—Bernard D. Pianalto
Attorney, Agent, or Firm—Birgit E. Morris

[57] ABSTRACT

A method for preparing an abrasive $SiO_x$ coating, wherein $1 \leq X \leq 2$, on a substrate by glow discharge deposition wherein the deposition on the substrate in a vacuum chamber is interrupted before the desired final $SiO_x$ coating thickness is obtained. $SiH_4$ and $N_2O$ are subjected to a glow discharge and $SiO_x$ is deposited onto the substrate. The deposition is interrupted, $SiH_4$ is removed from the vacuum chamber and the $SiO_x$ coating is exposed to oxygen. These steps are repeated until the desired final $SiO_x$ coating thickness is obtained.

6 Claims, 1 Drawing Figure

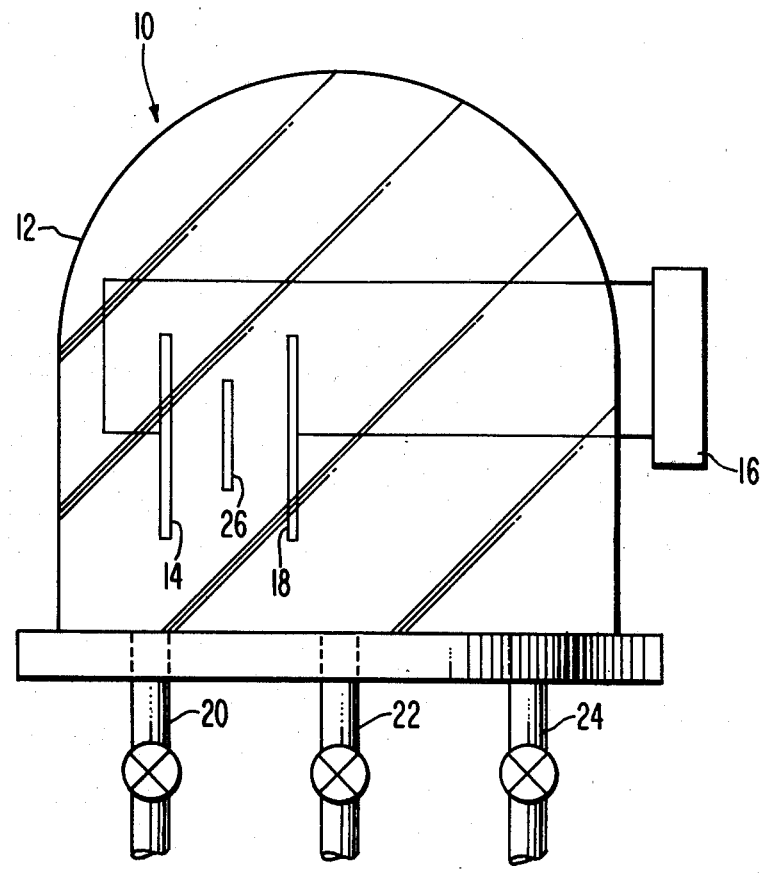

METHOD OF COATING SUBSTRATES WITH AN ABRASIVE LAYER

This invention relates to a method of preparing an abrasive coating. More particularly, this invention relates to a method of preparing an abrasive coating by a glow discharge deposition technique.

BACKGROUND OF THE INVENTION

Kaganowicz, in a copending application entitled, "METHOD FOR PREPARING AN ABRASIVE COATING", Ser. No. 963,819, filed Nov. 27, 1978, and incorporated herein by reference, discloses a method for preparing an abrasive silicon oxide coating, $SiO_x$, where $1 \leq x \leq 2$, on a substrate comprising glow discharging silane and a gaseous, oxygen-containing compound chosen from the group consisting of $N_2O$, $H_2O$ and $CO_2$. This coating is generally comparatively thin, e.g., on the order of 250 angstroms thick.

A thicker $SiO_x$ coating is sometimes needed. For example, Kaganowicz et al., in another copending application entitled, "A METHOD OF PREPARING AN ABRASIVE-COATED SUBSTRATE", Ser. No. 255,503 which is being filed concurrently with the present application and is incorporated herein by reference, teaches that the thickness and the refractive index of the $SiO_x$ coating influence its abrasive properties. Generally, a refractive index of between about 1.1 and 1.45 angstroms and a coating thickness of at least about 600 angstroms are preferred.

Dholakia, in U.S. Pat. No. 4,243,395 teaches a method of lapping the tip of a hard material having a sharp point which includes using an abrasive $SiO_x$ layer thick enough to prevent penetration by the sharp point through the layer to the substrate. For example, for a diamond having a point with a radius of from about 0.1 to about 0.01 micrometer or less a layer about 2000 angstroms thick may be required.

When a thick coating is required, the glow discharge deposition process may sometimes have to be interrupted, for example, to allow the substrate to cool, Wang et al., in U.S. Pat. No. 4,260,647, entitled, "METHOD FOR DEPOSITING AN ABRASIVE LAYER", issued Apr. 17, 1981, teach a method for preparing a thick abrasive silicon oxide layer from an organosilane and oxygen. According to Wang et al., when the deposition is interrupted, the previously deposited $SiO_x$ layer should be subject to a glow discharge in the presence of oxygen prior to resumption of the glow discharge deposition of $SiO_x$.

Because of the vigorous, spontaneous interaction between $O_2$ and $SiH_4$, the Wang et al. method is not attractive to use for $SiH_4$ as a starting material. It would therefore be desirable to have a method of glow discharge depositing a thick layer of $SiO_x$ from $SiH_4$ that does not require the glow discharge of oxygen and which leads to more abrasive coatings.

SUMMARY OF THE INVENTION

We have found a method of preparing an abrasive $SiO_x$ coating, wherein $1 \leq x \leq 2$, on a substrate by glow discharge deposition wherein the deposition on the substrate in a vacuum chamber is interrupted before the desired final $SiO_x$ coating thickness is obtained. Silane and $N_2O$ are subjected to a glow discharge and $SiO_x$ is deposited onto the substrate. The silane is removed from the vacuum chamber and the $SiO_x$ coating is exposed to oxygen. These steps are repeated until the desired final $SiO_x$ coating thickness is obtained.

BRIEF DESCRIPTION OF THE FIGURE

The FIGURE is a cross-sectional view of an apparatus suitable for glow discharge depositing a coating.

DETAILED DESCRIPTION OF THE INVENTION

In a glow discharge a plasma is formed as a result of the decomposition of the starting materials, i.e., $SiH_4$ and $N_2O$, by an electromagnetic field in an evacuated chamber. The silicon oxide product is then deposited onto a substrate and the gaseous byproducts removed.

We have found that by interrupting the glow discharge deposition, exposing the initial silicon oxide layer to oxygen and then continuing to deposit an additional silicon oxide layer, the final silicon oxide coating is more abrasive than using the prior art method.

Because $SiH_4$ and $O_2$ can violently and spontaneously react, it is important that the glow discharge vacuum chamber containing the substrate be free of $SiH_4$ prior to the introduction of oxygen. A preferred procedure of removing $SiH_4$ is to shut off the supply of $SiH_4$ into the vacuum chamber and pump out the $SiH_4$ remaining in the chamber. Then the chamber can be flushed with a chemically inert gas such as $N_2$, Ar and the like. The inert gas is then pumped out and the oxygen is allowed to enter the chamber. A convenient source of oxygen is air. Although the addition of oxygen to the chamber is preferably performed at atmospheric pressure, other pressures may also be employed.

The abrasive silicon oxide ($SiO_x$) material deposited according to the present invention may be viewed as a mixture of $SiO$ and $SiO_2$, that is, $1 \leq x \leq 2$. When the $SiO_2$ to $SiO$ ratio is greater than about 1, preferably greater than 1.5 and more preferably is about 2.5, the coating becomes extremely abrasive. The most abrasive $SiO_x$ coatings occur when there is only about 10-15 percent $SiO$ present. The abrasive material prepared is believed to be microcrystalline $SiO_2$ particles embedded in an amorphous $SiO_x$ coating. The size of the $SiO_2$ crystallites is probably on the order of 50 to 300 angstroms in diameter.

The mechanism by which the oxygen improves the abrasivity of the $SiO_x$ coating is not known. The oxygen may react with electron-deficient silicon atoms to form Si-O bonds which lead to a more abrasive material. The oxygen should preferably be in contact with the electron-deficient silicon atoms for enough time to react with these silicon atoms.

The present method may be used to prepare a new $SiO_x$ coating or to recondition an $SiO_x$ layer which has been worn down by repeated use in lapping. Hard materials such as diamond, sapphire and the like may be lapped with the $SiO_x$ coating of the present invention.

The resulting $SiO_x$ abrasive material may be deposited on any suitable substrate such as plastic, metal, glass, and the like. A preferred substrate for lapping diamond playback styli for use with a capacitive information disc record is fabricated from a vinyl chloride homopolymer or copolymer. The substrate may be coated with one or more metal layers such as copper, Inconel or the like prior to deposition of the $SiO_x$ coating.

The invention will be further described by reference to the FIGURE.

A glow discharge apparatus suitable for preparing the abrasive material is shown in the FIGURE generally as 10. The glow discharge apparatus 10 includes a vacuum chamber 12 which can be a glass bell jar. In the vacuum chamber 12 are two electrodes 14 and 18 which can be a screen, coil, or plate of a material that is a good electrical conductor and does not readily sputter, such as aluminum. A power supply 16, which may be DC or AC, is employed to obtain a voltage potential between the electrodes 14 and 18. An outlet 20 into the vacuum chamber 12 allows for evacuation of the system and is connected to a mechanical pump, not shown. A first inlet 22 and a second inlet 24 are connected to gas bleed systems, not shown, for adding the reactants employed to prepare the abrasive material.

In carrying out the process a substrate 26 to be coated is placed between the electrodes 14 and 18, typically maintained about 5 to 10 centimeters apart. The vacuum chamber 12 is then evacuated through the outlet 20 to a pressure of about $0.5-1 \times 10^{-5}$ torr. $N_2O$ is added through the first inlet 22 to its desired partial pressure and $SiH_4$ is added through the second inlet 24 until the desired partial pressure ratio of $SiH_4$ to $N_2O$ is obtained, for example, about 1 to 6.

In order to begin deposition of an abrasive coating on the substrate 26 a glow discharge is initiated between the electrodes 14 and 18 by energizing the power source 16. For deposition the current should be in the range of 200 to 900 milliamps, preferably 400 to 700 milliamps. Any convenient frequency such as 10 kilohertz or a radio frequency may be employed. The potential between electrodes 14 and 18 is generally about 1,000 volts.

A substrate 26 such as a vinyl chloride homopolymer or copolymer, whether or not metal coated, may warp when heated above about 50° C. During the glow discharge deposition of the abrasive coating, when the substrate 26 temperature approaches 50° C., the first inlet 24, the glow discharge power supply 16, and the second inlet 22 are in turn shut off and the system allowed to cool until the substrate temperature is reduced to about 25° C., which takes about 5 minutes. The vacuum chamber 12 is opened to the air, preferably for at least about 15 minutes. The vacuum chamber 12 is then re-evacuated and the $SiO_x$ glow discharge deposition is resumed.

The contacting of the $SiO_x$ layer with oxygen prior to glow discharge depositing an additional abrasive $SiO_x$ layer may be done at any time when the deposition is interrupted, even if the substrate 26 need not be cooled.

An application of the instant abrasive coating is for shaping a diamond playback stylus for use with a capacitive information disc record. A method for producing suitable styli is described in the patent of Keizer, U.S. Pat. No. 4,104,832. The tip of the stylus is shaped by means of a deep, coarse-pitched groove in a disc coated with an abrasive $SiO_x$ layer according to the instant invention.

The invention will be further illustrated by the following Example but it is to be understood that the invention is not meant to be limited by the details described therein.

EXAMPLE

A 30.5 centimeter diameter vinyl chloride homopolymer disc having a deep, coarse-pitched spiral groove in a surface and coated with a metal bilayer comprising a copper layer about 50 angstroms thick overcoated with a 200 angstrom thick layer of Inconel 600 (76.8 atom percent nickel, 13.8 atomic percent chromium and 8.5 atom percent iron) was placed in a 46 centimeter by 76 centimeter bell jar as described in the FIGURE which was then evacuated to $1 \times 10^{-5}$ torr. $N_2O$ was added to a partial pressure of 32 micrometers of mercury using a flow rate of 31.4 standard cubic centimeters per minute (sccm). $SiH_4$ was then added to a partial pressure of 5 micrometers of mercury at a flow rate of 7.3 sccm. The partial pressure ratio of $SiH_4$ to $N_2O$ was about 1 to 6.

The disc substrate was rotated at a rate of 30 revolutions per minute (rpm) between two 15 centimeter by 15 centimeter aluminum electrodes. These electrodes covered a strip approximately 6 centimeters wide on the disc. To create a glow between the electrodes 500 milliamps of current was supplied to the electrodes with a potential of about 1,000 volts at 10 kilohertz. Deposition of an abrasive $SiO_x$ coating onto the disc began and was continued for 2 minutes.

The flow of $N_2O$ and $SiH_4$ was stopped by closing the first inlet 22 and the second inlet 24, respectively, and the remaining gases in the vacuum chamber were pumped off. The vacuum chamber was flushed with nitrogen before the disc was opened to the air overnight.

The glow discharge procedure was then repeated and continued for 2 minutes. The disc was exposed to the air for 5 hours. The glow discharge was repeated for a third time. The total $SiO_x$ layer thickness was 778 angstroms and the refractive index was 1.432 as measured by a Rudolf Research Ellipsometer after the $SiO_x$ had been exposed to air.

Four diamond dielectric support elements were keel lapped over the same grooves of the lapping disc to form a keel-tipped stylus having a flat shoe. Each diamond element was lapped for 2 minutes and the shoe length of each stylus was then measured. The sum of the lengths of the shoes lapped for these four samples was 18.5 micrometers. The amount of material removed (in cubic micrometers) may be related to the shoe length by cubing the shoe length.

CONTROL

The experimental and test conditions were repeated as in the Example except that the intermediate $SiO_x$ coatings were not exposed to air. The $SiO_x$ coating was deposited in six 1-minute glow discharge depositions with a 15 minute cool down between each deposition in order to cool the substrate. Shorter deposition times were employed in the Control so that the substrate would not require a longer period to cool.

The thickness of the coating was 764 angstroms and the refractive index was 1.4491. Four diamond elements were keel-lapped as in the Example. The sum of the lengths lapped was 15.25 micrometers. Both the Control's and the Example's $SiO_x$ layer had comparable thicknesses and refractive indices.

The ratio between the values in the Example and the values in the Control for the total amount of diamond removed is about 1.8:1. Thus, almost twice the amount of diamond material was removed for the same lapping time using a coating made according to the instant invention.

We claim:

1. A method for preparing an abrasive silicon oxide coating on a substrate comprising:
   (a) placing said substrate in a vacuum chamber between two electrodes;

(b) forming a glow discharge in said chamber in the presence of silane and $N_2O$, thereby depositing a $SiO_x$ coating, wherein x is a number from 1–2, on said substrate;
(c) removing silane from said chamber;
(d) exposing said coating to oxygen; and
(e) repeating step (b) to deposit an additional layer of silicon oxide on said substrate.

2. A method according to claim 1 wherein the final thickness of said silicon oxide coating is at least about 600 angstroms.

3. A method in accordance with claim 1 wherein the refractive index of the final $SiO_x$ coating is between about 1.1 and 1.45.

4. A method in accordance with claim 1 wherein the initial silicon oxide coating is exposed to air at atmospheric pressure.

5. A method in accordance with claim 4 wherein the exposure is at least about 15 minutes in duration.

6. A method in accordance with claim 1 wherein the substrate is a copolymer or homopolymer of vinyl chloride.

* * * * *